US012804928B2

(12) United States Patent
Someya

(10) Patent No.: US 12,804,928 B2
(45) Date of Patent: Nov. 17, 2026

(54) SEMICONDUCTOR DEVICE

(71) Applicant: SANKEN ELECTRIC CO., LTD., Niiza (JP)

(72) Inventor: Ryo Someya, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 322 days.

(21) Appl. No.: 18/762,759

(22) Filed: Jul. 3, 2024

(65) Prior Publication Data

US 2025/0031397 A1 Jan. 23, 2025

(30) Foreign Application Priority Data

Jul. 21, 2023 (JP) ................................ 2023-118896

(51) Int. Cl.
*H10D 12/00* (2025.01)
*H10D 62/10* (2025.01)
*H10D 64/27* (2025.01)

(52) U.S. Cl.
CPC ......... *H10D 12/481* (2025.01); *H10D 62/109* (2025.01); *H10D 62/127* (2025.01); *H10D 64/513* (2025.01)

(58) Field of Classification Search
CPC .. H10D 62/127; H10D 62/106; H10D 62/142; H10D 62/393; H10D 84/811; H10D 62/112; H10D 64/23; H10D 64/232; H10D 84/101; H10D 84/161; H10D 64/513; H10D 12/038; H10D 12/035; H10D 30/668; H10D 64/117; H10D 8/422; H10D 62/128;
(Continued)

(56) References Cited

U.S. PATENT DOCUMENTS

2024/0145464 A1 * 5/2024 Nishi .................. H10D 84/617
2026/0068290 A1 * 3/2026 Sugiura ................. H10D 8/422

FOREIGN PATENT DOCUMENTS

JP 2004-349556 A 12/2004
JP 5383009 B2 1/2014
(Continued)

OTHER PUBLICATIONS

U. R. Vemulapati et al., "Analytical Model for the Initial Snapback Phenomenon in RC IGBTs," Aug. 2012, ISPS, Prague, Czech Republic (2012) IEEE, Reprinted from the Internacional Seminar on Power Semiconductors, Cited in the Specification.

*Primary Examiner* — Wasiul Haider
(74) *Attorney, Agent, or Firm* — METROLEX IP LAW GROUP, PLLC; Robert L. Scott, Esq.

(57) ABSTRACT

A semiconductor device according to one or more embodiments is disclosed. A first semiconductor region includes a first semiconductor region, a second semiconductor region, a third semiconductor region, a first trench and a fourth semiconductor region. A second semiconductor region includes a fifth semiconductor region, a sixth semiconductor region, a second trench, and a second inner trench electrode. A dummy region includes a seventh semiconductor region that is arranged on the first semiconductor region between the first semiconductor region and the second semiconductor region, a third trench penetrating the seventh semiconductor region in a depth direction; and a third inner trench electrode electrically connected to the first inner trench electrode through a third insulating film in the third trench.

7 Claims, 13 Drawing Sheets

(58) Field of Classification Search
CPC .. H10D 12/417; H10D 12/418; H10D 62/109; H10D 12/415; H10D 12/411–491; H10D 12/00
See application file for complete search history.

(56) References Cited

FOREIGN PATENT DOCUMENTS

| | | | |
|---|---|---|---|
| JP | 2015-154000 | A | 8/2015 |
| JP | 2018-46187 | A | 3/2018 |
| JP | 2022-56498 | A | 4/2022 |

* cited by examiner

SEMICONDUCTOR DEVICE

CROSS REFERENCE TO RELATED APPLICATIONS

This application claims priority to prior Japanese Patent Application No. 2023-118896 filed with the Japan Patent Office on Jul. 21, 2023, the entire contents of which are incorporated herein by reference.

BACKGROUND

This disclosure relates to a semiconductor device.

Conventionally, Reverse Conducting IGBT (RC-IGBT), the semiconductor device in which an Insulated Gate Bipolar Transistor (IGBT) and a diode for reflux are formed on a single semiconductor substrate, has been proposed. In the RC-IGBT, when the IGBT is turned on, the electrons in the drift region are transferred to the cathode region of the diode that does not have a collector region, causing the injection of holes from the collector layer of the IGBT into the drift region is suppressed, and conductivity modulation of the IGBT is less likely to occur, which is called snapback phenomenon. Further, the semiconductor device provided with a region for improving the breakdown voltage called a reduced surface field region in the outer peripheral area is disclosed.

The following references are examples of the related art.

JP2015-154000 (Patent Document 1)

JP2022-56498 (Patent Document 2)

JP2018-46187 (Patent Document 3)

JP2004-349556 (Patent Document 4)

Patent No. JP5383009 (Patent Document 5)

U. R. Vemulapati, N. Kaminski, D. Silber, L. Storasta, and M. Rahimo, "Analytical Model for the Initial Snapback Phenomenon in RCIGBTs," I SPS, August 2012, Prague, Czech Republic, (2012) IEEE. Reprinted from the Internacional Seminar on Power Semiconductors. (Non-Patent Document 1)

SUMMARY

The semiconductor device according to the one or more embodiments includes a first semiconductor region including a first semiconductor region of the first conductivity type, a second semiconductor region of the second conductivity type placed on the first semiconductor region, and a third semiconductor region of the first conductivity type provided on the second semiconductor region, a first trench provided to penetrate the second semiconductor region in the depth direction, and a first inner trench electrode provided in the first trench via a first insulating film, a fourth semiconductor region of the second conductivity type placed under the first semiconductor region and on the opposite side of the second semiconductor region, an upper electrode electrically connected to the third semiconductor region, and a lower electrode electrically connected to the fourth semiconductor region, a second semiconductor region including a fifth semiconductor region of the second conductivity type provided on the first semiconductor region electrically connected to the upper electrode, a second trench provided so as to penetrate the fifth semiconductor region in the depth direction, a second inner trench electrode provided in the second trench via a second insulating film, a sixth semiconductor region of the first conductivity type electrically connected to the lower electrode under the first semiconductor region, and a dummy region including a seventh semiconductor region of the second conductivity type provided on the first semiconductor region between the first and the second semiconductor region, a third trench provided so as to penetrate the seventh semiconductor region in the depth direction, and a third inner trench electrode electrically connected to the first inner trench electrode via a third insulating film in the third trench.

DETAILED DESCRIPTION

Next, one or more embodiments are described with reference to the drawings. In the description of the following drawings, the same or similar parts are denoted by the same or similar numerals. However, it may be noted that the drawings are schematic, and the relationship between the thickness and the planar dimensions, the ratio of the length of each part, etc. are different from the real ones. Therefore, the specific dimensions may be considered with reference to the following explanation. In addition, there may be parts where the relationship and ratio of the dimensions of each other are different between the drawings.

Further, one or more embodiments described below are examples for embodying a technical idea, and the technical idea does not specify the shape, structure, arrangement, or the like of the component parts as follows. One or more embodiments may make various changes. According to one or more embodiments, terms specifying the upper and lower parts such as "above" and "below" are used for the convenience of description, and may include cases provided on the sides. In addition, "on" includes not only the case where it is formed in contact with the object, but also the case where it is formed through another layer. Further, according to one or more embodiments, "connection" is not limited to direct connection, and includes a case where something such as a resistor is interposed in between.

When one or more embodiments are described, the XYZ axis may be defined in the figure. For example, in the cross-sectional view, the left and right directions may be in the X axis direction, the vertical direction may be in the Y axis direction, and the direction perpendicular to the XY plane may be in the Z axis direction. Depending on the arrangement of the pattern, it may be changed accordingly. In the following description, the semiconductor device is mainly described as an Insulated Gate Bipolar Transistor (IGBT), but it may be the semiconductor device formed with the diode for reflux on a single semiconductor substrate, or a MOSFET may be used instead of an IGBT. It may also be an element of another insulated gate structure such as an Injection Enhanced Gate Transistor (IEGT). It may also be a Super Junction MOSFET or a Complementary Metal Oxide Semiconductor Field Effect Transistor (CMOSFET).

First Embodiment

Figure 1:
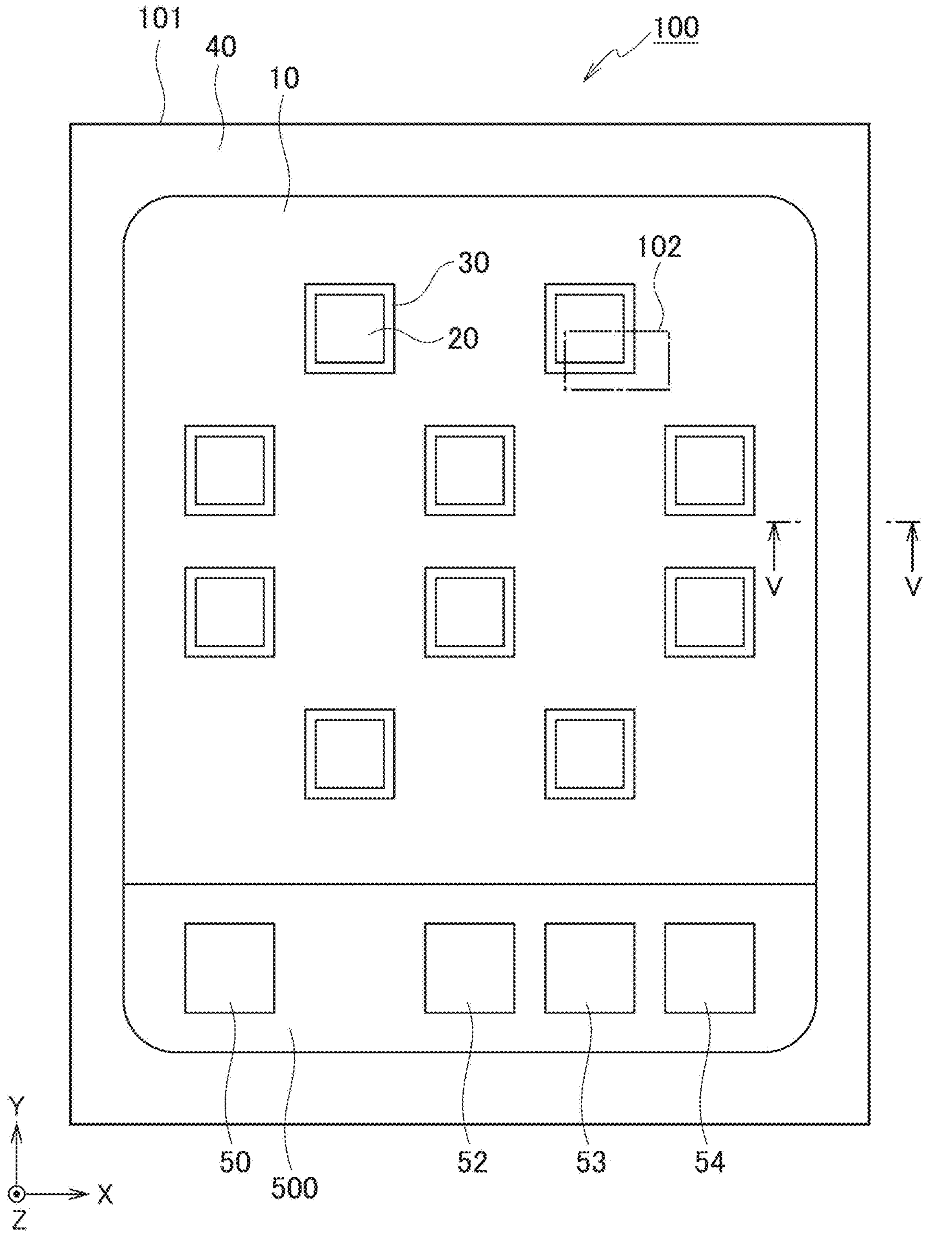
FIG. 1 is a diagram illustrating an upper surface of an overall structure of the semiconductor device according to the first embodiment.

FIG. 1 is a top view of the overall structure of the semiconductor device 100 according to the first embodiment.

As shown in FIG. 1, the semiconductor device 100 according to the first embodiment includes a semiconductor substrate 101, a diode region 20 placed on the semiconductor substrate 101, and an IGBT 10 placed around the diode region 20 on the semiconductor substrate 101. In the semiconductor device 100 according to the first embodiment, the diode region 20 is arranged in an island-like shape, a dummy region 30 is provided around the diode region 20, and the IGBT 10 is placed outside thereof. That is, in the longitudinal direction of the trench 14 of the IGBT 10, the IGBT 10, the dummy region 30, the diode region 20, the dummy region 30, the IGBT 10, the dummy region 30, the diode region 20 . . . and is arranged to repeat.

The semiconductor device 100 according to the first embodiment constitutes a reverse conduction IGBT (RC-IGBT) obtained by forming an IGBT 10 and a reflux diode region 20 on a single semiconductor substrate 101. The termination region 40 of the outer peripheral area of the semiconductor device 100 is provided with an area for improving the breakdown voltage called the reduced surface field region. The IGBT 10 is placed around the diode region 20 which is arranged on the semiconductor substrate 101 in an island-like shape. A boundary region 30 is provided around the diode region 20. The boundary region 30 is also referred to as a dummy region. In the example shown in FIG. 1, a control pad 500 is also provided on the semiconductor substrate 101. Although not shown in FIG. 1, an emitter pad 51 is provided on the IGBT 10 or/and the diode region 20.

The control pad 500 includes, for example, a current sense pad 50, a gate pad 52, and temperature sense pads 53 and 54. The current sense pad 50 is a control pad for detecting a current flowing in the cell region of the semiconductor device 100.

The gate pad 52 is a control pad to which a gate drive voltage is applied for on-off control of the semiconductor device 100. The temperature sense pads 53 and 54 are, for example, control pads electrically connected to the anode and cathode of the temperature sense diode provided in the semiconductor device 100.

Figure 2:
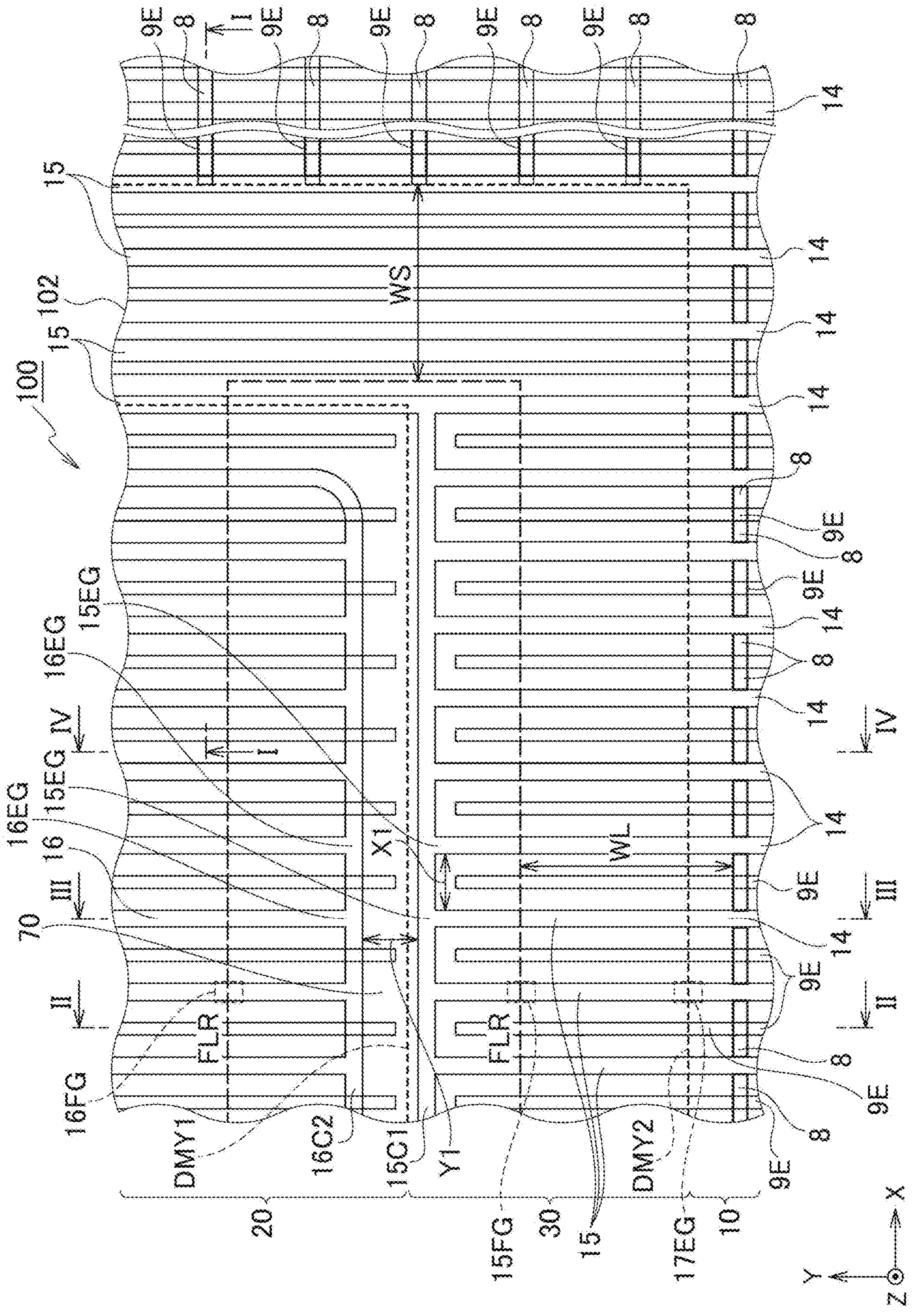
FIG. 2 is a diagram illustrating an enlarged upper surface of a portion of FIG. 1.

FIG. 2 is an enlarged top view of the semiconductor device 102 of a portion of FIG. 1. FIG. 2 shows how the diode region 20, the boundary region (dummy region) 30 surrounding the diode region 20, and the IGBT 10 surrounding the boundary region 30 are arranged. The inside of the dashed line FLR represents the region (boundary line with or without the presence of the eighth semiconductor region) for the eighth semiconductor region (FLR region) described later. The dashed line DMY1 represents the boundary line between the diode region 20 and the boundary region 30. The dashed line DMY2 represents the boundary line between the IGBT 10 and the boundary region 30.

In the IGBT 10, a plurality of trenches 14 are extended in the first direction (longitudinal direction, Y direction) and arranged parallel to the second direction (transverse direction, X direction). Each of the trenches 14 is connected to each of the trenches 15 in the boundary region 30 in the Y direction.

At the end of the trench 16 in the Y direction of the diode region 20, a connection trench 16C2 is arranged extending in the second direction orthogonal to the Y direction. The plurality of trenches 16 are extended in the Y direction and are arranged parallel to the second direction (transverse direction, X direction), and are terminated in a T-shaped structure in the connection trench 16C2.

In the part of the boundary region 30 between the diode region 20 and the IGBT 10 seen in the Y direction from the diode region 20, an end of the trench 15 is arranged so as to be separated from the trench 16 and the connection trench 16C2 of the diode part 20 on the extension line in the Y direction. At the end in the Y direction of the trench 15 in the boundary region 30, a connection trench 15C1 extending in the X direction is provided. In the boundary region 30, a plurality of trenches 15 are extended in the Y direction and terminated in a T-shaped structure at the connection trench 15C1.

The first end 15EG in the Y direction extended from the trench 15 is connected to the first end 15EG in the Y direction extended from the adjacent trench 15 via the connection trench 15C1.

The second end 16EG in the Y direction extended from the trench 16 is connected to the second end 16EG in the Y direction extended from the adjacent trench 16 via the connection trench 16C2.

The distance Y1 between the first end 15EG in the Y direction extended from the trench 15 and the second end 16EG in the Y direction extended from the trench 16 is the same as or less than the distance X1 between adjacent trenches 15 in the X direction of the trench 15 in the boundary region 30. That is, Y1<=X1 is established.

Further, as shown in FIG. 2, in the part of the boundary region 30 between the diode region 20 and the IGBT 10 seen in the X direction from the diode region 20, a plurality of trenches 15 are extended in the Y direction and are parallel in the second direction (transverse direction, X direction). Then, each of a plurality of trenches 15 in the boundary region 30 is connected to each of the plurality of trenches 14 of the IGBT 10 existing in the Y direction from the diode region 20 at the third end 17EG, and the trench 15 and the trench 14 are continuous.

A eighth semiconductor region 70 of the second conductivity type (FIG. 4) is arranged between the point 15FG in the first direction where the third trench 15 is extended and the point 16FG in the first direction where the second trench 16 is extended.

With respect to the distance from the P-type eighth semiconductor region 70 having a low impurity concentration in the boundary region 30 to the emitter region 8 of the IGBT 10, the longitudinal (Y direction) distance WL of the trench 15 is arranged so that the longitudinal (Y direction) distance WL is longer than the distance WS in the transverse direction (X direction) of the trench 15. That is, WL>WS are established. The emitter region 8 in the X direction (WS) as seen from the diode region 20 includes a plurality of trenches 15 between the diode region 20, and the trench 15 may inhibit electrons from spreading from the emitter region to the diode region 20 side, and the distance WS may be made shorter than the distance WL.

In the IGBT 10, there is a hole on the P base region 7 sandwiched between the trench 14 in the X direction, and the hole extends in the Y direction. Below the bottom of the hole and on the Z direction of the P base region 7, the P-type emitter contact region 9E is placed. The n emitter region 8 is placed at the opening of the trench 14, and the n emitter region 8 is exposed on the side of the hole. The n emitter region 8 is adjacent to the trench 14 as shown in FIG. 2 and is discretely arranged in the Y direction. The n emitter region 8 is arranged at regular intervals in the Y direction, but it is not necessary to arrange them with regularity in the Y direction. The n emitter region 8 may be arranged intermittently. Thus, in the IGBT 10, an area in which the n emitter region 8 is placed and an area in which the n emitter region 8 is not placed may be included. By intermittently arranging the n emitter region 8 in the IGBT 10, excessive electron injection may be suppressed and the switching time may be shortened.

Figure 3:
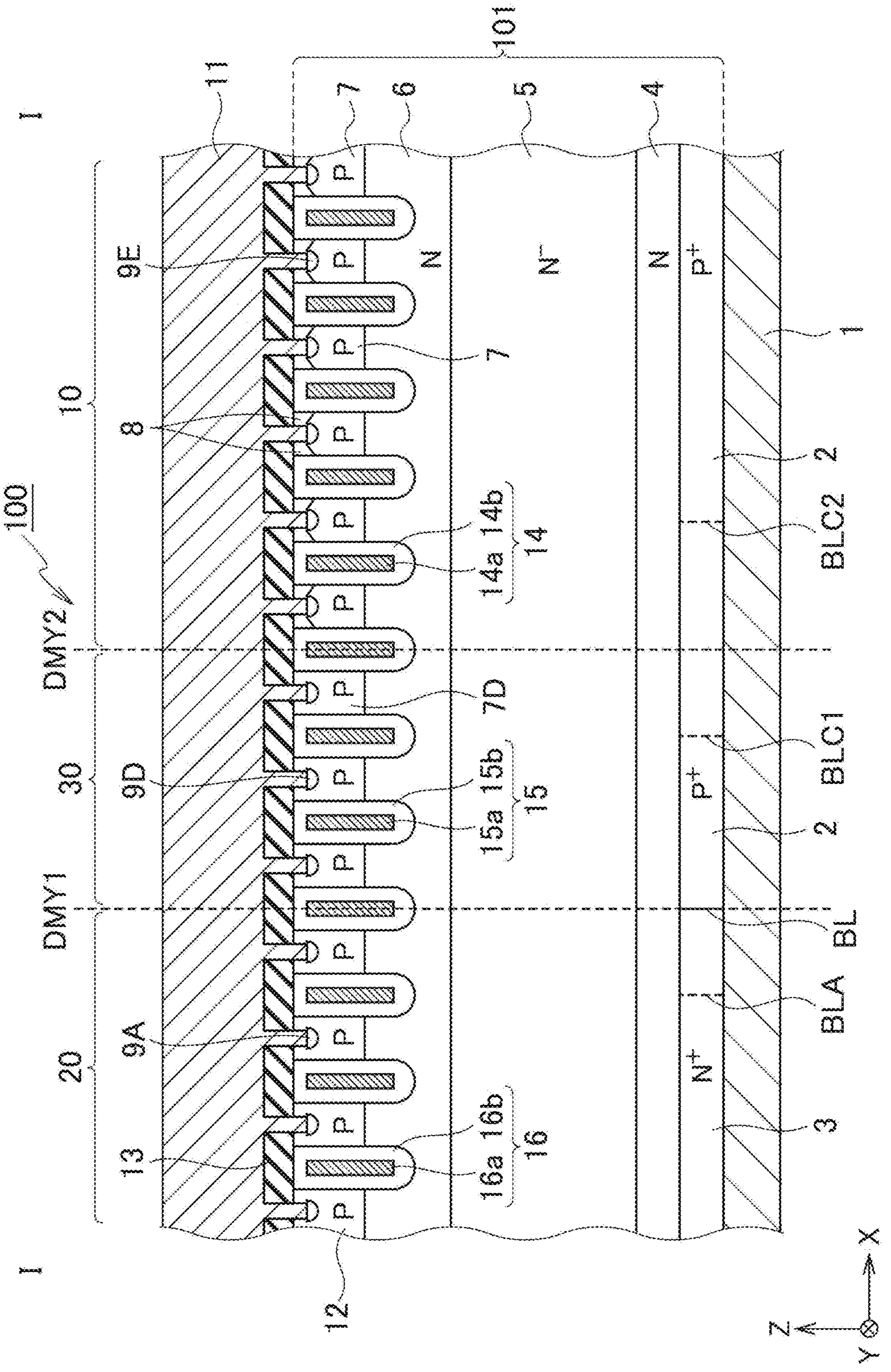
FIG. 3 is a diagram illustrating a cross-sectional view along the I-I lines of FIG. 2 for example.

FIG. 3 is a cross-sectional view along the I-I line of FIG. 2. FIG. 3 shows a cross-sectional structure along the XZ plane in a range across the diode region 20, the boundary region 30, and the IGBT 10. In FIG. 3, the dashed line DMY1 extending in the Z direction represents the boundary line between the diode region 20 and the boundary region 30. Further, the dashed line DMY2 extending in the Z direction represents the boundary line between the IGBT 10 and the boundary region 30. In FIG. 2, a part of the trench 14 along the I-I line is omitted, but in FIG. 3, five trenches are shown.

The semiconductor device 100 according to the first embodiment includes a first semiconductor region 10, a second semiconductor region 20, and a dummy region 30.

The first semiconductor region 10 includes a first semiconductor region 5 of the first conductivity type, a second semiconductor region 7 of the second conductivity type provided on the first semiconductor region 5, a third semiconductor region 8 of the first conductivity type provided above the second semiconductor region 7, and a first trench 14 provided to penetrate the second semiconductor region 7 in the depth direction, the first inner trench electrode 14*a* provided in the first trench 14 via the first insulating film 14*b*, the fourth semiconductor region 2 of the second conductivity type provided on the opposite side under the first semiconductor region 5 and facing the second semiconductor region 7, the upper electrode 11 electrically connected to the third semiconductor region 8, and the lower electrode 1 electrically connected to the fourth semiconductor region 2.

The second semiconductor region 20 is electrically connected to the upper electrode 11 and includes a fifth semiconductor region 12 of the second conductivity type provided above the first semiconductor region 5, and a sixth semiconductor region 3 of the first conductivity type electrically connected to the lower electrode 1 under the first semiconductor region 5 and provided on the opposite side of the fifth semiconductor region 12.

The dummy region 30 is between the first semiconductor region 10 and the second semiconductor region 20, and includes a seventh semiconductor region (P dummy region) 7D of the second conductivity type provided on the first semiconductor region 5, a third trench 15 provided so as to penetrate the seventh semiconductor region 7D in the depth direction, a third inner trench electrode 15*a* electrically connected to the first inner trench electrode 14*a* via the third insulating film 15*b* in the third trench 15.

As shown in FIG. 3, the semiconductor substrate 101 includes, for example, an N-type high-resistance drift region 5, an N-type accumulation region 6 placed in the Z direction above the drift region 5 and having an impurity concentration higher than the drift region 5, a P-type base regions 7 and 7D and anode regions 12 placed in the Z direction on the accumulation region 6, an N-type buffer region 4 placed below the drift region 5 (in the negative Z direction), a P-type collector region 2 and an N-type cathode region 3 placed below the buffer region 4 (negative Z direction).

The diode region 20 includes an N-type high-resistance drift region 5, an N-type accumulation region 6 placed on the drift region 5, a P-type anode region 12 provided on the accumulation region 6, and the trench 16 provided so as to penetrate the anode region 12 in the depth direction (Z direction).

In the diode region 20, the anode region 12 is extended in the Y direction between the trenches 16 extending in the Y direction. Further, a hole is placed in the Z direction of the anode region 12, and a P-type anode contact region 9A is provided at the bottom thereof. An emitter electrode (upper electrode) 11 is provided inside the hole, and the anode contact region 9A is connected to the emitter electrode (upper electrode) 11. The trench 16 includes an inner trench electrode 16*a* and an insulating film 16*b*. The inner trench electrode 16*a* is connected to the emitter electrode (upper electrode) 11. Note that the trench 16 penetrates the anode region 12, but does not penetrate the accumulation region 6.

In the boundary region 30, an N-type accumulation region 6 is arranged on the drift region 5, and the base region 7D is extended in the Y direction between the trenches 15 extending in the Y direction. Further, a P-type dummy contact region 9D is placed on the Z direction of the base region 7D. The dummy contact region 9D connected to the base region 7D is connected to the emitter electrode (upper electrode) 11. The trench 15 includes an inner trench electrode 15*a* and an insulating film 15*b*. The inner trench electrode 15*a* is electrically connected to the inner trench electrode 14*a* of the. Unlike the IGBT 10, an emitter region 8 is not provided in contact with the trench 15 in the Z direction of the base region 7D of the boundary region 30. The trench 15 penetrates the base region 7D, but does not penetrate the accumulation region 6. The base region 7D may be simultaneously formed with the same P-type doping material and impurity density as the base region 7 and the anode region 12.

The includes an N-type drift region 5, an N-type accumulation region 6 placed on the drift region 5, a P-type base region 7 provided on the accumulation region 6, and a trench 14 provided so as to penetrate the base region 7 in the depth direction (Z direction). Here, the trench 14 does not penetrate the accumulation region 6.

In the IGBT region 10, the base region 7 is extended in the Y direction between the trenches 14 extending in the Y direction. Further, an emitter region 8 is provided in contact with the trench 14 on the Z direction of the base region 7. Further, a hole is carved on the Z direction of the base region 7, and a P-type emitter contact region 9E is placed at the bottom. The emitter contact region 9E extends in the Y direction on the base region 7 sandwiched between the trenches 14. The emitter region 8 and the emitter contact region 9E are electrically connected to the emitter electrode (upper electrode) 11. The trench 14 includes an inner trench electrode 14*a* and an insulating film 14*b*. The inner trench electrode 14*a* is electrically connected to the gate pad 52 of FIG. 2.

In the base region 7 sandwiched between the trench 14 in the X direction, an N-type emitter region 8 and a P-type emitter contact region 9E are placed. This detailed structure will be described later with reference to FIG. 11.

The lower electrode 1 provided in the negative Z direction of the semiconductor substrate 101 is a collector electrode electrically connected to the P-type collector region 2 in the IGBT region 10, and a cathode electrode electrically connected to the N-type cathode region 3 in the diode region 20. Further, in the example of FIG. 3, the boundary line BL between the collector region 2 and the cathode region 3 is provided on the boundary line between the diode region 20 and the boundary region 30. The boundary line between the diode region 20 and the boundary region 30 is indicated by the dashed line DMY1. Further, as shown in the dashed line BLC1, the boundary line BL between the collector region 2 and the cathode region 3 may be provided in the boundary region 30. Further, as shown in the dashed line BLC2, the boundary BL between the collector region 2 and the cathode region 3 may be provided in the IGBT region 10. Further, as shown in the dashed line BLA, the boundary line BL between the collector region 2 and the cathode region 3 may be provided in the diode region 20. Thus, the position of the boundary BL between the collector region 2 and the cathode region 3 changes the relative area between the P-type collector region 2 and the N-type cathode region 3. For this reason, since the injection amount of the carrier changes, it may be possible to appropriately change the switching characteristics of the semiconductor device 100 as an RC-IGBT depending on the application.

Figure 4:
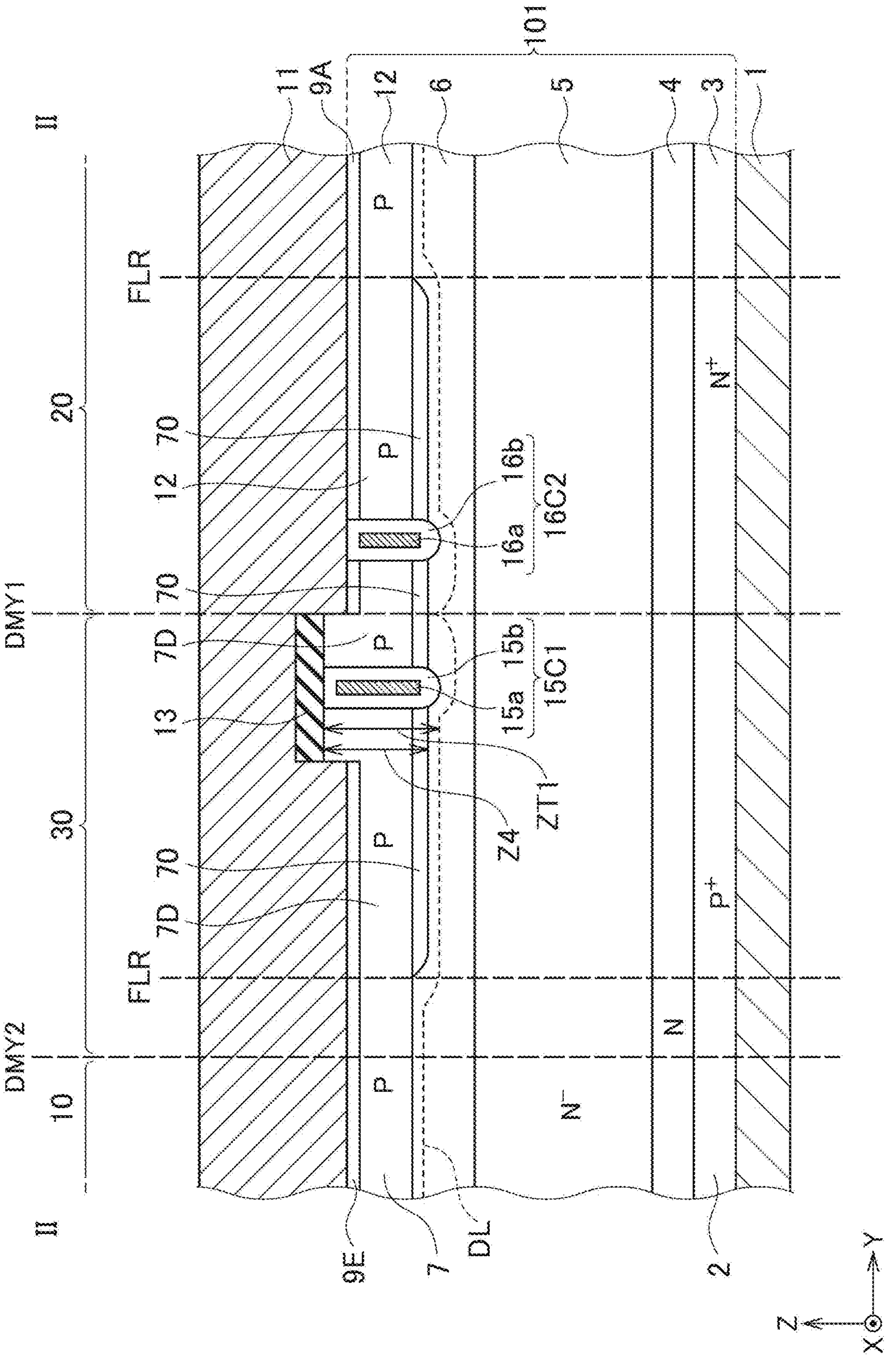
FIG. 4 is a diagram illustrating a cross-sectional view along the II-II lines of FIG. 2 for example.

FIG. 4 is a cross-sectional view along the II-II lines of FIG. 1. FIG. 4 shows a cross-sectional structure along the YZ plane in a range across the diode region 20, the boundary region (dummy region) 30, and the emitter electrode 11 of the IGBT region 10 connected to the P-type emitter contact region 9E. In FIG. 4, the dashed line DMY1 extending in the Z direction represents the boundary line between the diode region 20 and the boundary region 30. Further, the dashed line DMY2 extending in the Z direction represents the boundary line between the IGBT region 10 and the boundary region 30. In FIG. 4, the dashed line FLR extending in the Z direction represents the boundary between the presence or absence of the eighth semiconductor region 70.

The eighth semiconductor region 70 includes a bottom that is shallower than the bottom of the second trench 16 and deeper than the bottom of the seventh semiconductor region (P dummy region) 7D, and is provided between the point 15FG in the first direction that the second trench 16 extends and the point 16FG in the first direction that the second trench 16 extends.

That is, the eighth semiconductor region 70 is not only directly under the base region 7D of the boundary region 30 sandwiched between the connection trench 15C1 and the connection trench 16C2, but also partially extended and placed directly under the base region 7D of the boundary region 30 in the negative Y direction than the side wall of the connection trench 15C1, and also partially extended and placed directly below the anode region 12 of the diode region 20 in the Y direction than the side wall of the connection trench 1602. The dashed line DL schematically shows the depletion layer in the thermal equilibrium state that extends within the N-type semiconductor region 6. The connection trench 15C1 of the boundary region 30 includes the inner trench electrode 15*a* and the insulating film 15*b*. The connection trench 16C2 of the diode region 20 includes the inner trench electrode 16*a* and the insulating film 16*b*. As shown in FIG. 4, it may be seen that by providing an eighth semiconductor region 70, the depletion layer is reduced from entering in the Z direction in the region sandwiched between the connection trench 15C1 and the connection trench 16C2.

Further, an anode contact region 9A is placed in the base region 7D between the connection trench 15C1 and the connection trench 16C2, and the anode contact region 9A is electrically connected to the emitter electrode 11.

Figure 5:
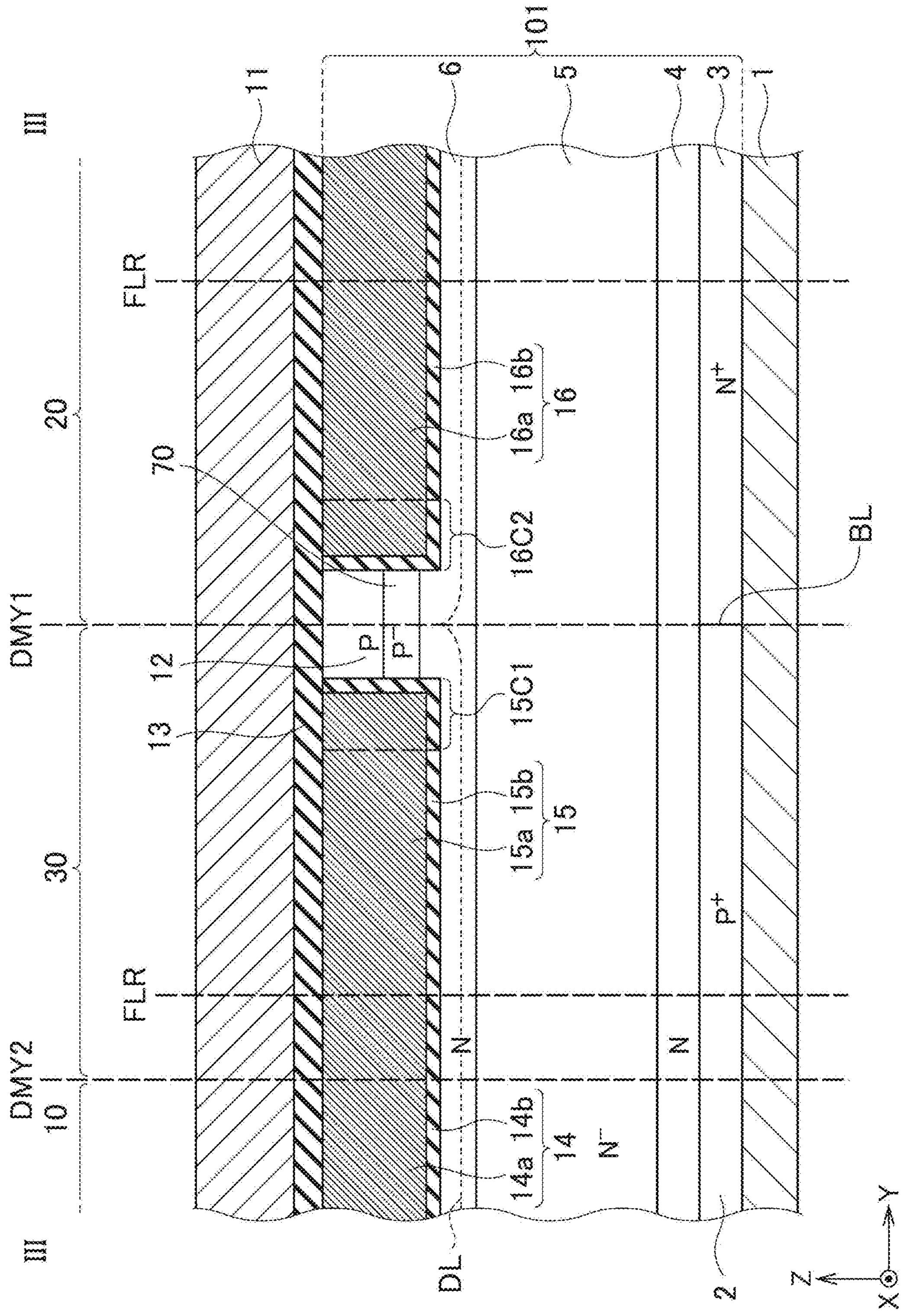
FIG. 5 is a diagram illustrating a cross-sectional view along the III-III lines of FIG. 2 for example.

FIG. 5 is a cross-sectional view along the III-III lines of FIG. 1. FIG. 5 shows a cross-sectional structure in a range across the diode region 20, the dummy region 30, and the IGBT region 10. That is, a cross-sectional structure along the YZ plane of the trench 14 and the trench 16 is shown. In FIG. 5, the dashed line DMY1 extending in the Z direction represents the boundary line between the diode region 20 and the boundary region 30. Further, the dashed line DMY2 extending in the Z direction represents the boundary line between the IGBT region 10 and the boundary region 30. In FIG. 5, the dashed line FLR extending in the Z direction represents the boundary of the eighth semiconductor region 70. The dashed line DL schematically shows the depletion layer in the thermal equilibrium state that extends within the N-type semiconductor region 6.

As shown in FIG. 5, between the first end 15EG extended in the Y direction of the trench 15 in the boundary region 30 and the second end 16EG extended in the Y direction of the trench 16 in the diode region 20, a eighth semiconductor region 70 of the second conductivity type having a junction depth that is deeper than the P anode region 12 of the diode region 20 is provided. The extended first end 15EG in the Y direction of the trench 15 of the boundary region 30 is placed in the connection trench 15C1, and the extended second end 16EG in the Y direction of the trench 16 of the diode region 20 is placed in the connection trench 16C2. As shown in FIG. 5, it may be seen that by providing the eighth semiconductor region 70, the depletion layer is reduced from entering in the Z direction in the region where the trench between the longitudinal direction of the trench 15 and the longitudinal direction of the trench 16 is not placed.

Figure 6:
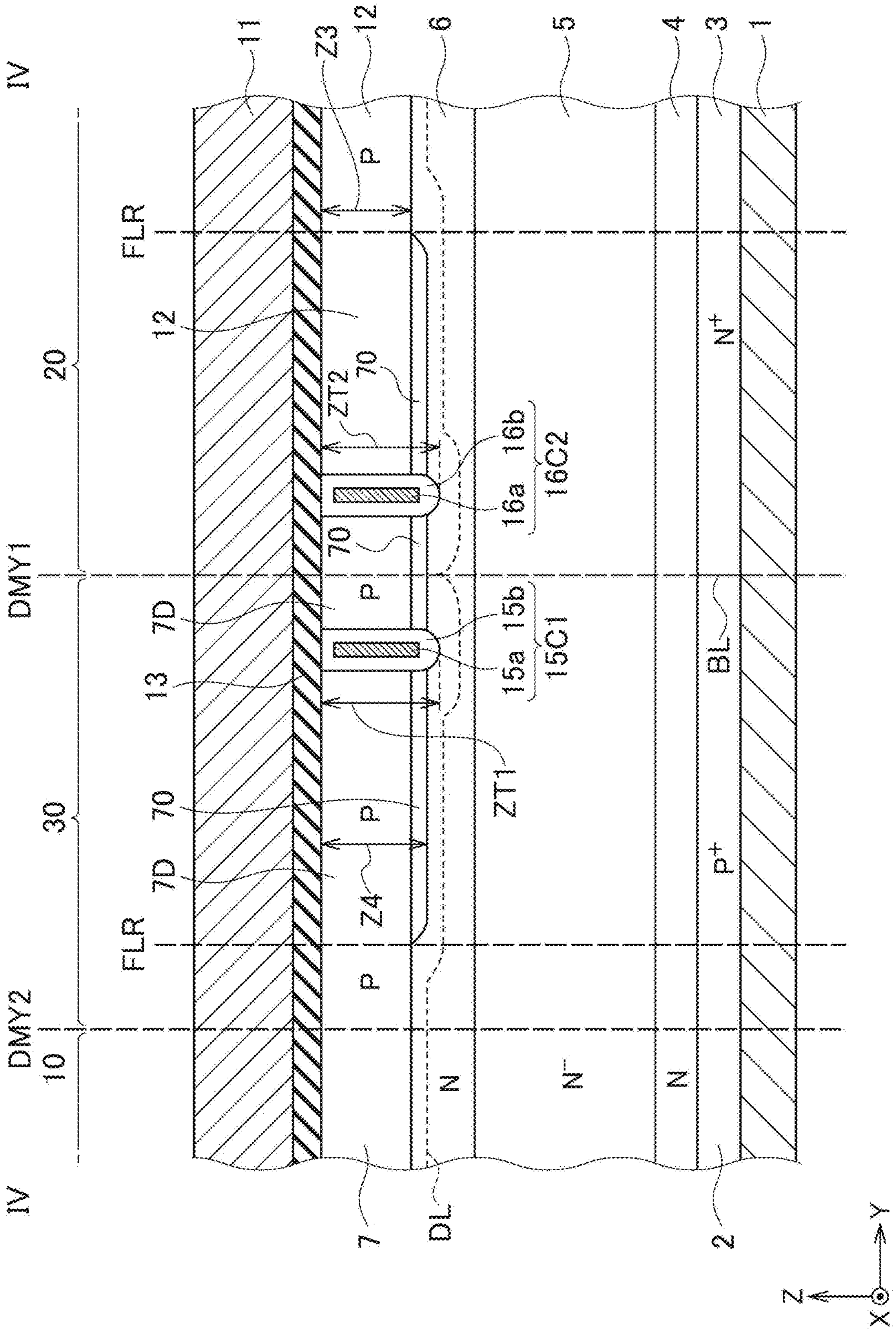
FIG. 6 is a diagram illustrating a cross-sectional view along the IV-IV lines of FIG. 2 for example.

FIG. 6 is a cross-sectional view along the IV-IV lines of FIG. 1. FIG. 6 shows a cross-sectional structure across the diode region 20, the boundary region 30, and the IGBT region 10. That is, a cross-sectional structure along the YZ plane in the range along the anode region 12, the eighth semiconductor region 70, the P base region 7, and 7D is shown. The dashed line DL schematically shows a depletion layer in a thermal equilibrium state in which the depletion layer spreads in the N-type semiconductor region 6. As shown in FIG. 6, it may be seen that by providing the eighth semiconductor region 70, the depletion layer is reduced from entering in the Z direction in the region (7D, 12) between the connection trench 15C1 and the connection trench 16C2.

The impurity concentration NP (70) in the eighth semiconductor region 70 is lower than the impurity concentration NP (7) in the base region 7. That is, NP (70)<NP (7) are established. Further, the impurity concentration NP (70) in the eighth semiconductor region 70 is lower than the impurity concentration NP (12) in the anode region 12. That is, NP (70)<NP (12) are established.

Further, as shown in FIG. 6, the junction depth Z4 of the eighth semiconductor region 70 is deeper than the junction depth Z3 of the anode region 12.

Further, the junction depth Z4 of the eighth semiconductor region 70 is shallower than the depth ZT1 of the trench 15 of the dummy region 30. Further, as shown in FIG. 5, the depth of the trench 14 of the IGBT region 10 is equal to the depth ZT1 of the trench 15 in the dummy region 30, so that the junction depth Z4 of the eighth semiconductor region 70 is shallower than the depth of the trench 14 of the IGBT region 10.

Further, the junction depth Z4 of the eighth semiconductor region 70 is shallower than the depth ZT2 of the trench 16 of the diode region 20.

In the semiconductor device 100 according to the first embodiment, the diode region 20 is arranged in an island-like shape, and the IGBT region 10 is placed around the diode region 20. In addition, since the portion having the trench 15 of the dummy region 30 extended from the IGBT region 10 is continuous from the trench 14, in the following description, it may be described as the trench 14 of the IGBT region (including the dummy region) 10. The trench 15 of the dummy region 30 is not provided with an emitter region 8, but the trench 14 of the IGBT region 10 is provided with an emitter region 8.

The longitudinal direction of the trench 14 of the IGBT region (including the dummy region) 10 in which the inner trench electrode 14*a* is embedded through the insulating film 14*b* and the longitudinal direction of the trench 16 of the diode region 20 in which the inner trench electrode 16*a* is embedded at the same potential as the emitter electrode 11 through the insulating film 16*b* are placed in the same Y direction, but the two trenches are separated from each other. It may be desirable that the trench 16 of the diode region 20 is placed on the longitudinal extension of the trench 14 of the IGBT region (including the dummy region) 10. Thereby, from a planar point of view, the electric field concentration in the boundary region 30 may be alleviated and the spread of the depletion layer may be smoothed.

Further, it may be desirable that the distance Y1 between the longitudinal first end 15EG of the trench 15 on the extension line of the trench 14 of the IGBT region 10 and the longitudinal second end 16EG of the trench 16 of the diode region 20 is the same as or less than the X1, distance between the adjacent trenches in the transverse direction (X direction) of the trench 15 on the extension line of the trench 14 of the same IGBT region 10 (trench interval of the dummy region 30).

A P-type semiconductor region (FLR region: eighth semiconductor region 70) having a lower impurity concentration than that of the P base region 7 of the IGBT region 10 is arranged on the N-type drift region 5 in the boundary region 30 of the longitudinal first end 15EG of the trench 15 on the extension line of the trench 14 of the IGBT region 10 and of the longitudinal second end 16EG of the trench 16 of the diode region 20, As a result, the depletion layer is reduced from entering in the Z direction in the accumulation region 6 below the base region 7D leading to the longitudinal first end 15EG of the trench 15 and the longitudinal second end 16EG of the trench 16. Then, the depletion layer of the semiconductor region including the eighth semiconductor region 70 in the boundary region 30 between longitudinal first end 15EG of the trench 15 on the extension of the trench 14 of the IGBT region (including the dummy region) 10 and the longitudinal second end 16EG of the trench 16 of the diode region 20 may be made to spread more easily.

Further, it may be desirable that the P-type eighth semiconductor region 70 having a low impurity concentration in the boundary region 30 has a deeper junction depth than the base region 7 of the IGBT region 10, and a deeper junction depth than the anode region 12 of the diode region 20. However, the junction depth of the eighth semiconductor region 70 may not be deep to the bottom of the trench (trench depth) of the IGBT region 10 or the diode region 20. This is to shift the breakdown point from the boundary region 30 to the IGBT region 10 side.

The P-type eighth semiconductor region 70 having the low impurity concentration of the boundary region 30 is arranged further inside than the first end 15EG of the trench 15 (in the negative Y direction on the IGBT region 10 side than the first end 15EG of the trench 15), so as to include the first end 15EG of the trench 15 in dummy region 30. Similarly, the eighth semiconductor region 70 is placed to the inside of the diode region 20 (Y direction) than the second end 16EG of the trench 16 so as to include the second end 16EG of the trench 16 of the diode region 20.

The first end 15EG of the trench 15 is connected to the adjacent first end 15EG of the trench 15 by a connection trench 15C1. That is, the first end 15EG of the trench 15 has a T-shape. Then, through the inner trench electrode 15*a* in the trench 15 and the inner trench electrode 15*a* in the connection trench 15C1, the adjacent inner trench electrodes 15*a* in the dummy region 30 are electrically connected. As a result, the gate bus line does not need to be placed on the semiconductor substrate 101 in the boundary region 30, and the upper electrode 11 on the semiconductor substrate 101 is continuously placed from the IGBT region 10 to the diode region 20 without being interrupted by the gate bus line. Further, since inner trench electrode 15*a* and the inner trench electrode 16*a* are extended in the X direction, the electric field distribution in the X direction of the area between the connection trench 15C1 and the connection trench 16C2 may be made more uniform.

As shown in FIG. 2, in the transverse direction (X direction) of the trench 14 of the IGBT region 10 as seen from the dashed line FLR (eighth semiconductor region 70), the dummy trench 15 without any emitter region 8 is placed in parallel with the trench 14 of the IGBT region 10 between the P-type eighth semiconductor region 70 having a low impurity concentration in the boundary region 30 and the emitter region 8 so that the P-type eighth semiconductor region 70 having a low impurity concentration in the boundary region 30 does not touch (not reach) the emitter region 8.

As shown in FIG. 6, the boundary BL of the P collector region 2 and the N cathode region 3 is placed directly under the substantial Z direction of the boundary region 30, but the boundary BL of the P collector region 2 and the N cathode region 3 may not be placed directly under the boundary region 30 and may be positioned out of alignment. For example, the boundary BL of the P collector region 2 and the N cathode region 3 may be on the diode region 20 side from directly below the boundary region 30. Alternatively, it may be on the IGBT region 10 side.

The P-type eighth semiconductor region 70 having a low impurity concentration in the boundary region 30 is electrically connected to the upper electrode (emitter electrode) 11.

(Reduced Surface Field Structure)

Figure 7:
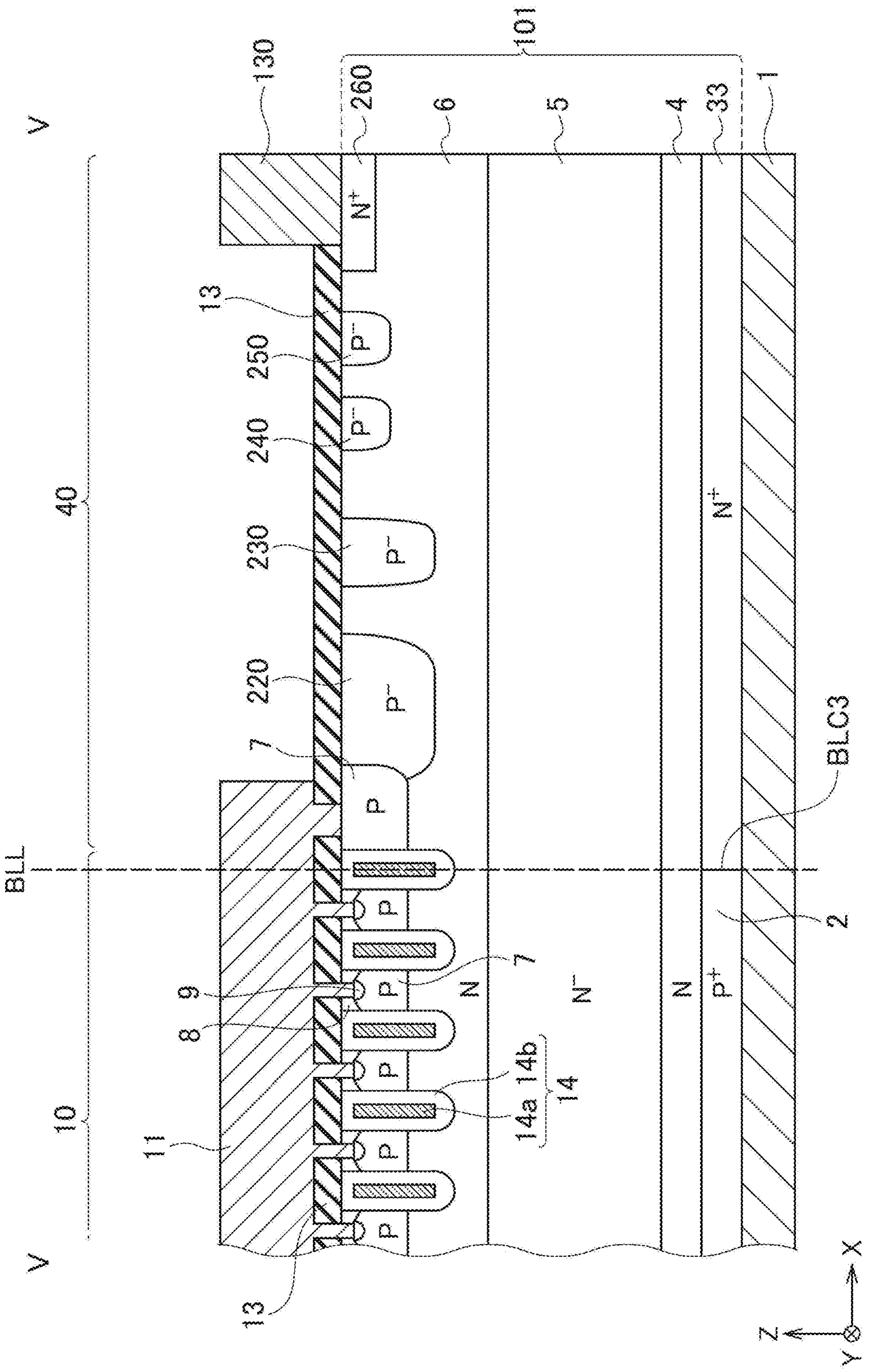
FIG. 7 is a diagram illustrating a cross-sectional view along the V-V lines of FIG. 2 for example.

FIG. 7 is a cross-sectional view along the V-V line of FIG. 1.

The semiconductor device 100 according to the first embodiment includes a first reduced surface field region 220 and a second reduced surface field region 230 in the termination region 40. The first reduced surface field region 220 is electrically connected to the P base region 7 to improve the breakdown voltage. The second reduced surface field region 230 is electrically connected to the first reduced surface field region 220 via a depletion layer. The dashed line BLL extending in the Z direction indicates the boundary between the IGBT region 10 and the termination region 40. The lower electrode 1 is electrically connected to the P-type collector region 2 of the IGBT region 10. Further, the lower electrode 1 is electrically connected to the N-type semiconductor region 33 in the termination region 40. The N-type semiconductor region 33 has the same potential as the cathode region 3 of the diode region 20. Further, the N-type semiconductor region 33 has the same potential as an N-type stopper layer 260 at the terminus. The boundary between the P-type collector region 2 of the IGBT region 10 and the N-type semiconductor region 33 is shown by BL3.

The semiconductor substrate 101 has an N-type drift region 5 constituting one surface thereof. The plurality of reduced surface field regions 220 and 230 are included a P-type semiconductor region having a lower impurity concentration than that of the P-base region 7, and are arranged in the surface region of the drift region 5 so as to surround the IGBT region 10. Since the reduced surface field regions 220 and 230 are formed simultaneously with the P-type eighth semiconductor region 70 having a low impurity concentration in the boundary region 30, the junction depth is shallower than the trench 14 and deeper than the P base region 7.

Further around the second reduced surface field region 230, the floating limiting ring diffusion layers 240 and 250 are placed. Further, the N-type stopper layer 260 is placed at the terminus. A stopper electrode 130 is electrically connected to the stopper layer 260.

The floating limiting ring diffusion layers 240 and 250 are provided to smooth the shape of the depletion layer and reduce the electric field concentration. The floating limiting ring diffusion layers 240 and 250 are formed from a P-type diffusion layer that is equal to or shallower than the reduced surface field regions 220, 230. Further, the impurity concentration of the floating limiting ring diffusion layers 240 and 250 is set equal to or higher than the impurity concentration of the reduced surface field regions 220 and 230.

The P-type eighth semiconductor region 70 having a low impurity concentration in the boundary region 30 may be formed simultaneously with the first reduced surface field region 220 and the second reduced surface field region 230. For this reason, even if the P-type eighth semiconductor region 70 having a low impurity concentration in the boundary region 30 is additionally placed, the manufacturing process due to the placement may be suppressed.

The semiconductor device 100 according to the first embodiment may easily realize a high breakdown voltage by equipped with the reduced surface field regions 220 and 230.

As shown in FIG. 2, the IGBT region 10 includes a portion in which the emitter region 8 is placed and a portion in which the emitter region 8 is not placed. A portion in which the emitter region 8 is placed and a portion in which the emitter region 8 is not placed are alternately arranged repeatedly. The portion in which the emitter region 8 is placed and the portion in which the emitter region 8 is not placed may not necessarily be arranged regularly. Further, as shown in FIGS. 3 to 6, the diode region 20 includes a portion in which an N cathode region 3 electrically connected to the lower electrode 1 is provided. The dummy region 30 is placed between the IGBT region 10 and the diode region 20, and includes a portion in which the emitter region 8 is not placed on the upper surface side and the P collector region 2 is placed on the lower surface side.

The trenches 14, 16, and 15 are arranged in the IGBT region 10, the diode region 20, and the dummy region 30, respectively, and the inner trench electrodes **14*a*, 16*a*, and 15*a* are provided therein, respectively. The inner trench electrode 14*a* of the IGBT region 10 and the inner trench electrode 15*a* of the dummy region 30 are electrically connected to the gate pad and are gate potential, and the inner trench electrode 15*a* in the trench 16 of the diode region 20 is electrically connected to the upper electrode 11. Here, in the structure of the semiconductor device 100 according to the first embodiment, the gate signal of the dummy region 30 becomes a high level (the IGBT is turned on). Then, since the dummy region 30 has a positive charge in the inner trench electrode 15*a*, electrons present in the N drift region 5 around the inner trench electrode 15*a* are reduced from moving to the cathode region 3. As a result, compared to the case of a comparative example (hereinafter referred to as a comparative example) in which the inner trench electrode 15*a* of the dummy region 30 is electrically connected to the upper electrode 11, there are more holes in the N drift region 5 of the dummy region 30 and there are more holes exist in the N drift region 5 in the semiconductor device 100**. Thereby, the snapback phenomenon may be further reduced.

According to the semiconductor device 100 according to the first embodiment, the snapback phenomenon may be suppressed by setting the inner trench electrode **15*a* of the trench 15 in the dummy region 30 at the same potential as the inner trench electrode 14*a* of the trench 14 in the IGBT region 10. Similarly, the inner trench electrode 15*a* electrically connected to the inner trench electrode 14*a* of the IGBT region 10 is provided in the connection trench 15C1 in the dummy region 30, the transfer of electrons present in the N drift region 5 around the connection trench 15C1 to the cathode region 3 is reduced. As a result, compared to the case of the comparative example, there are more holes in the N drift region 5 around the connection trench 15C1 of the dummy region 30**, and the snapback phenomenon may be further reduced.

(Device Simulation Results of Snapback Operation)

Figure 8A:
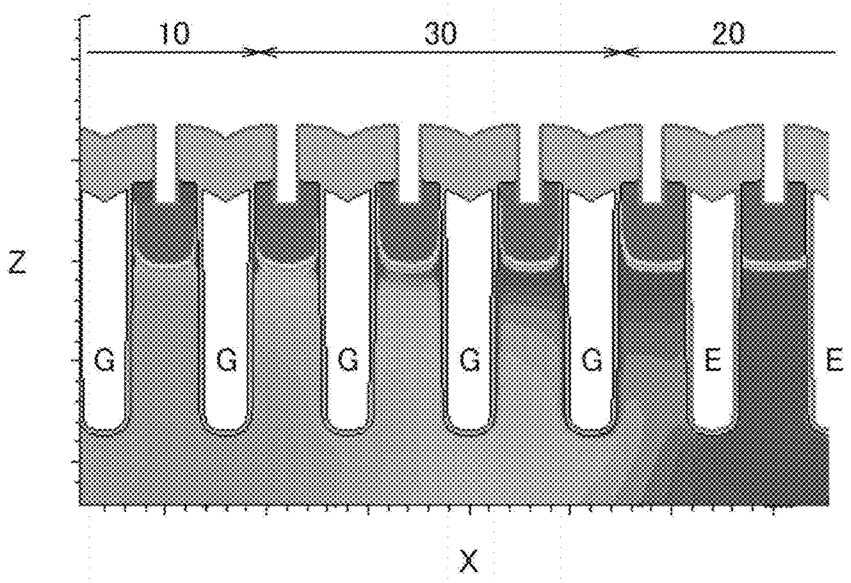
FIG. 8A is a diagram illustrating a simulation result of an electromagnetic field distribution in the middle phase of snapback operation in a dummy region in a semiconductor device according to a first embodiment.
Figure 8B:
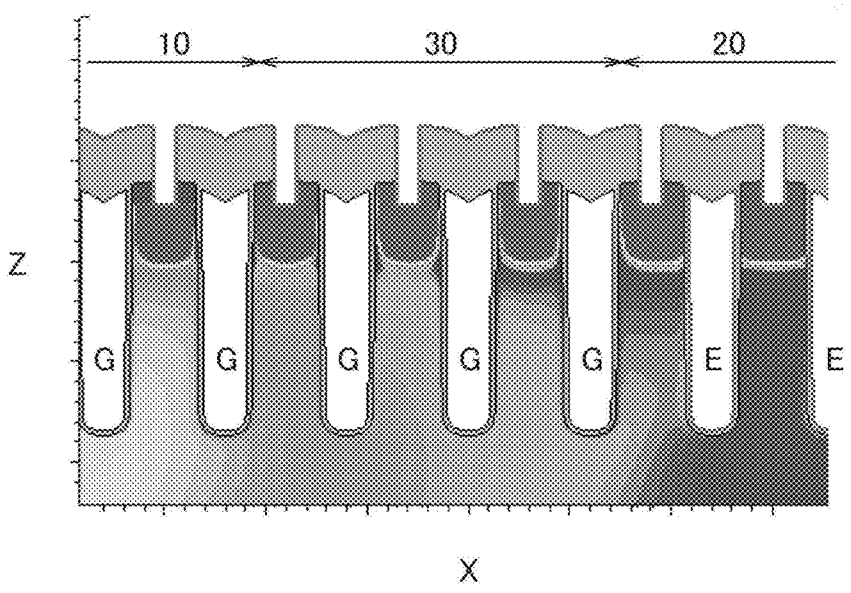
FIG. 8B is a diagram illustrating a simulation result of an electromagnetic field distribution in the late phase of snapback operation in a dummy region in a semiconductor device according to a first embodiment.

FIG. 8A is a simulation result of the electromagnetic field distribution in the middle period of snapback operation in the dummy region 30 in the semiconductor device 100 according to the first embodiment. FIG. 8B is a simulation result of the electromagnetic field distribution in the late stage of the snapback operation in the dummy region 30 in the semiconductor device 100 according to the first embodiment.

Figure 9A:
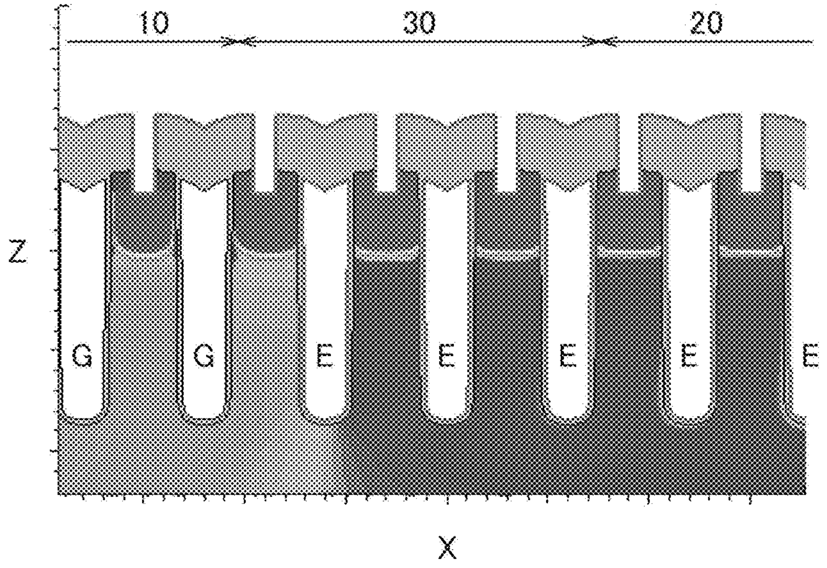
FIG. 9A is a diagram illustrating a simulation result of an electromagnetic field distribution in the middle phase of snapback operation in a dummy region in a semiconductor device according to the comparative example.
Figure 9B:
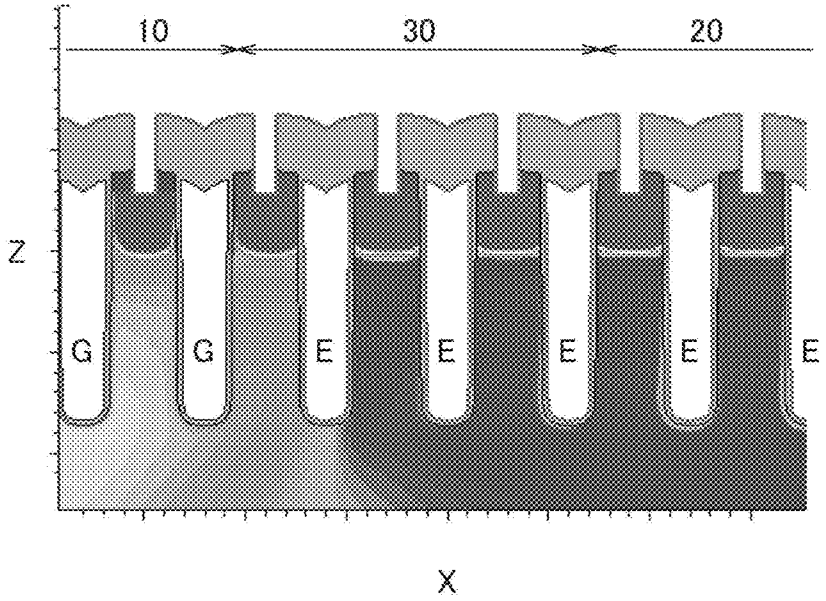
FIG. 9B is a diagram illustrating a simulation result of an electromagnetic field distribution in the late phase of snapback operation in a dummy region in a semiconductor device according to a comparative example.

On the other hand, FIG. 9A is a simulation result of the electromagnetic field distribution in the middle period of snapback operation in the dummy region 30 in the semiconductor device according to the comparative example described above. FIG. 9B is a simulation result of the electromagnetic field distribution in the late stage of snapback operation in the dummy region 30 in the semiconductor device according to the comparative example.

In FIGS. 8A, 8B, 9A, and 9B, the portion indicated by G indicates a portion having the same potential as the inner trench electrode 14*a* of the trench 14 in the IGBT region 10. Further, the portion indicated by E indicates a portion having the same potential as the emitter electrode 11.

In the structure of the semiconductor device 100 according to the first embodiment, as shown in FIGS. 8A and 8B, holes are spread and present around the trench 15 in the dummy region 30, and conductivity modulation is promoted, which promotes the initiation of IGBT mode and has the effect of suppressing the snapback phenomenon. The widening of the hole is due to the positive application of the potential of the inner trench electrode 15*a* of the dummy region 30 when the IGBT is turned on. When electrons are attracted to the potential of the inner trench electrode 15*a*, the potential below the dummy region 30 is lowered, prompting the injection of holes from the collector region. Thereby, there is a hole around the trench 15 in the dummy region 30.

In the structure of the comparative example, it may be seen that there are no holes around the trench 15 in the dummy region 30 and the conductivity modulation is reduced. This has led to a noticeable snapback phenomenon. In the structure of the comparative example, since the inner trench electrode 15*a* in the dummy region 30 is equal to the emitter potential, the electrons in the drift region 5 are relatively easy to move to the cathode region 3. For this reason, in the structure of the comparative example, this does not reduce the potential in the drift region 5 of the dummy region 30, and the injection of holes from the collector region 2 is also reduced compared to the first embodiment.

(Variations)

Figure 10:
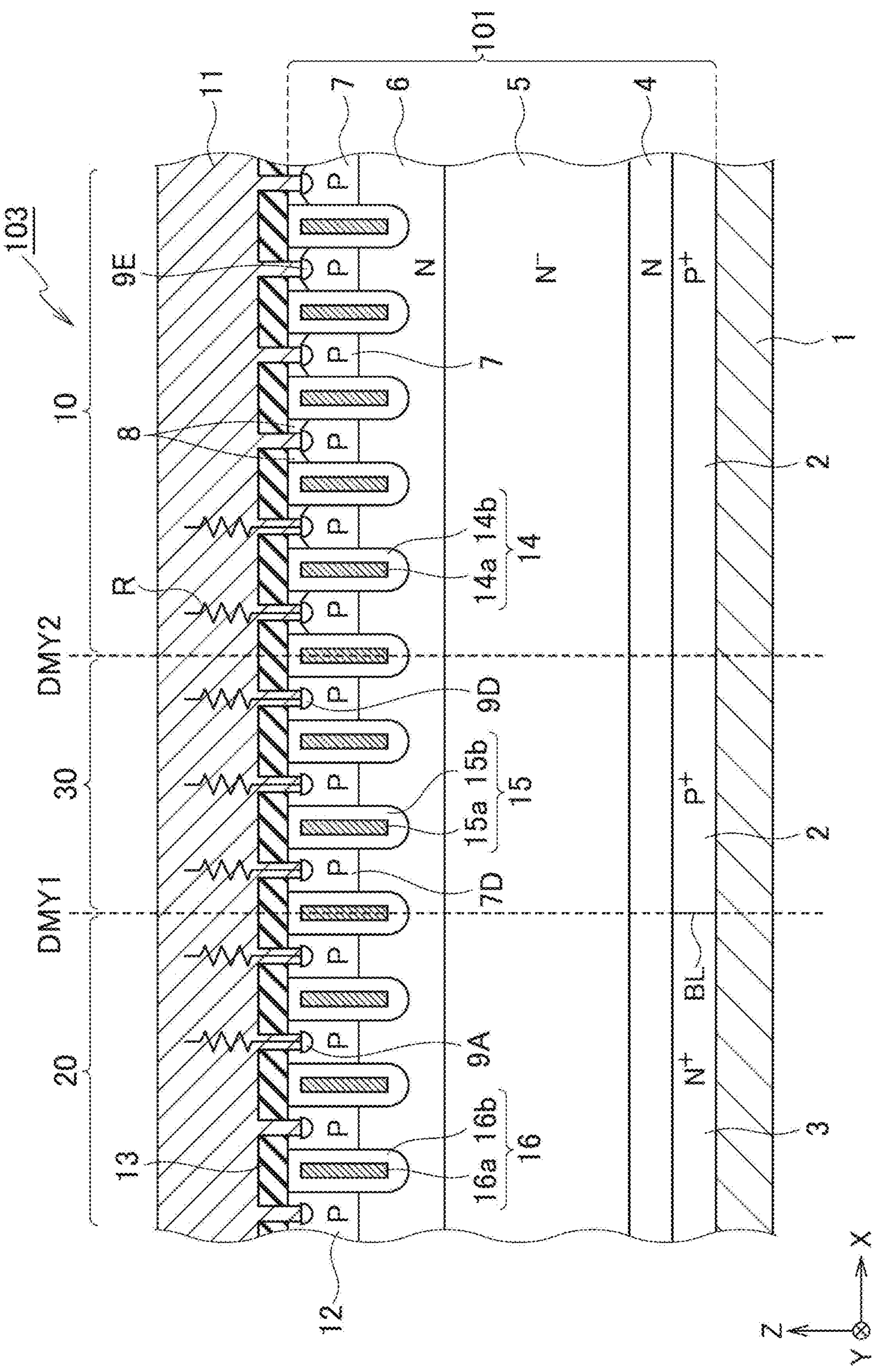
FIG. 10 is a diagram illustrating a cross-sectional view of a semiconductor device according to a modification of a first embodiment.

FIG. 10 is a cross-sectional view corresponding to FIG. 3 of the semiconductor device 103 according to a modification of the first embodiment. In the semiconductor device 103 according to a modification of the first embodiment, the P-base region 7D of the boundary region 30 may be electrically connected to the upper electrode (emitter electrode) 11 via a resistor R. Further, the P base region 7 of the IGBT region 10 close to the boundary region 30 may also be electrically connected to the upper electrode (emitter electrode) 11 via a resistor R. Further, the P anode region 12 of the diode region 20 close to the boundary region 30 may also be electrically connected to the upper electrode (emitter electrode) 11 via a resistor R.

The P-type eighth semiconductor region 70 having a low impurity concentration in the boundary region 30 may be electrically connected to the upper electrode (emitter electrode) 11 via a resistor. For example, since the P-type eighth semiconductor region 70 has a low impurity concentration and is electrically connected to the upper electrode 11 with a relatively large contact resistance, when the diode region 20 is turned on, the amount of hole injected from the P-type eighth semiconductor region 70 in the boundary region 30 to the N-type drift region 5 may be reduced, and the reverse recovery time of the diode region 20 may be shortened.

(Emitter Contact Structure)

Figure 11:
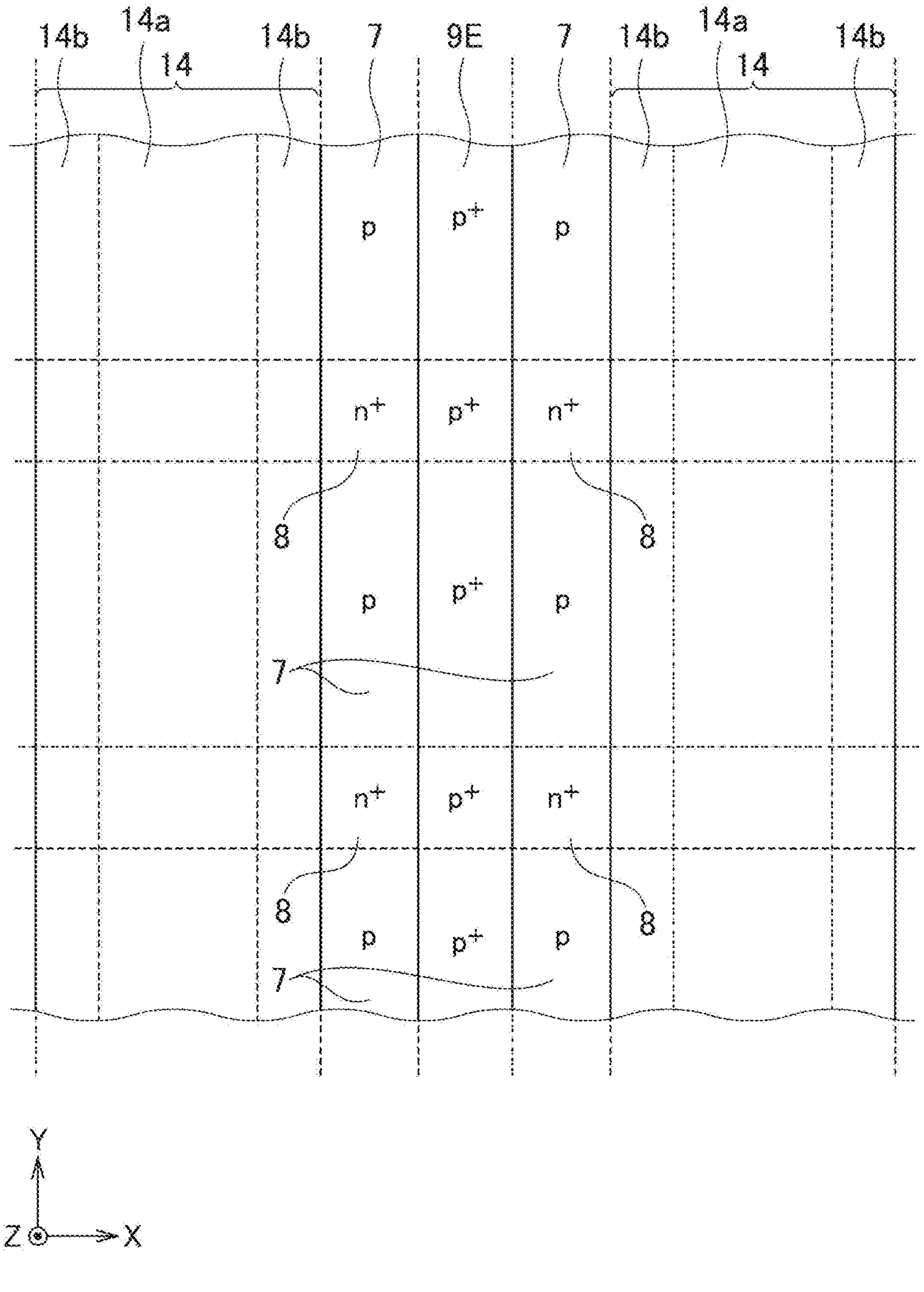
FIG. 11 is a diagram illustrating an upper surface of a portion of a IGBT of a semiconductor device according to the first embodiment.

FIG. 11 is a top view of a portion of the semiconductor device according to the first embodiment.

In the IGBT region 10, the P base region 7 is extended in the Y direction between the trenches 14 extending in the Y direction. Further, an n emitter region 8 is placed in contact with the trench 14 in the Z direction of the P base region 7. Further, there is a hole between the adjacent trenches 14, and a P-type emitter contact region 9E is placed below the bottom of the hole and in the Z direction of the P base region 7. The P-type emitter contact region 9E extends in the Y direction on the P base region 7 sandwiched between the trench 14. The n emitter region 8 exposed on the side of the hole and the emitter contact region 9E at the bottom of the hole are electrically connected to the emitter electrode (upper electrode) 11 embedded in the hole.

A structure consisting of the n emitter region 8, the base region 7, the n emitter region 8 exposed on the side surface of the hole in the Y direction where the P-type emitter contact region 9E is placed is placed. The structure is located on the ZY plane of the hole. The n emitter region 8 does not necessarily need to be arranged with regularity in the Y direction. By intermittently arranging the n emitter region 8 in the IGBT region 10, excessive electron injection may be suppressed and the switching time may be shortened.

Second Embodiment

Figure 12:
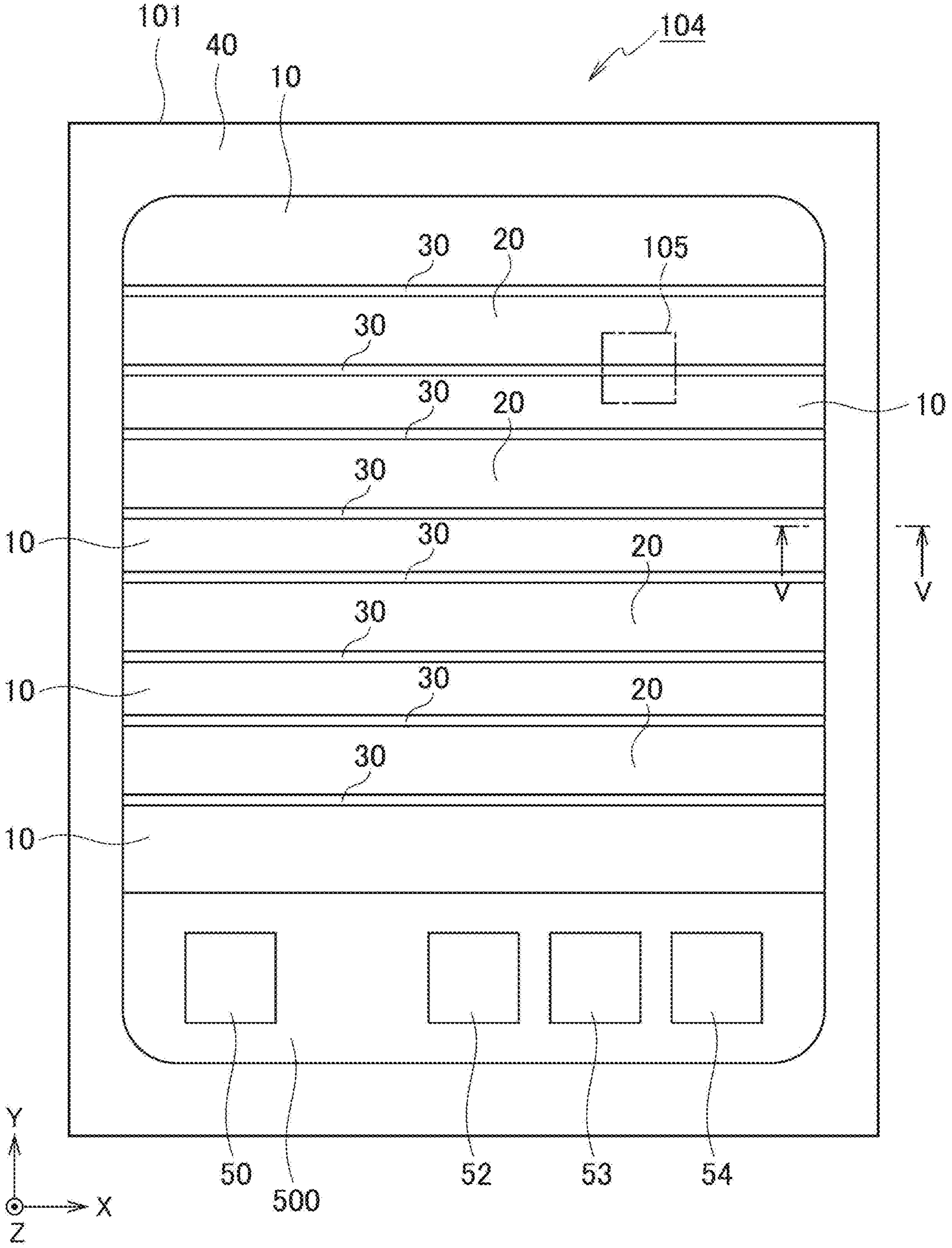
FIG. 12 is a diagram illustrating an upper surface of an overall structure of a semiconductor device according to a second embodiment, for example.

FIG. 12 is a top view of the overall structure of the semiconductor device 104 according to the second embodiment.

As shown in FIG. 12, the semiconductor device 104 according to the second embodiment includes the semiconductor substrate 101, the diode region 20 extended in the X direction on the semiconductor substrate 101 and arranged in a stripe shape, and an IGBT region 10 placed adjacent to the diode region 20 on the semiconductor substrate 101 in the plus or minus Y direction. The semiconductor device 104 according to the second embodiment also constitutes an RC-IGBT in which the IGBT region 10 and the reflux diode region 20 are arranged on one semiconductor substrate 101 in the same manner as in the first embodiment. In the termination region 40 of the outer peripheral area of the semiconductor device 104, an area for improving the breakdown voltage called a reduced surface field region is provided. The IGBT region 10 is extended in the X direction and is arranged in a stripe shape, adjacent to the positive or negative Y direction of the diode region 20 arranged in a stripe on the semiconductor substrate 101 in the X direction and arranged in a stripe shape. A boundary region (dummy region) 30 is provided between the diode region 20 and the IGBT region 10. In the example shown in FIG. 12, the control pad 500 is also provided on the semiconductor substrate 101. Although not shown in FIG. 12, the emitter pad 51 is provided on the IGBT region 10 or/and the diode region 20. The control pad 500 includes the current sense pad 50, the gate pad 52, and the temperature sense pads 53 and 54.

Figure 13:
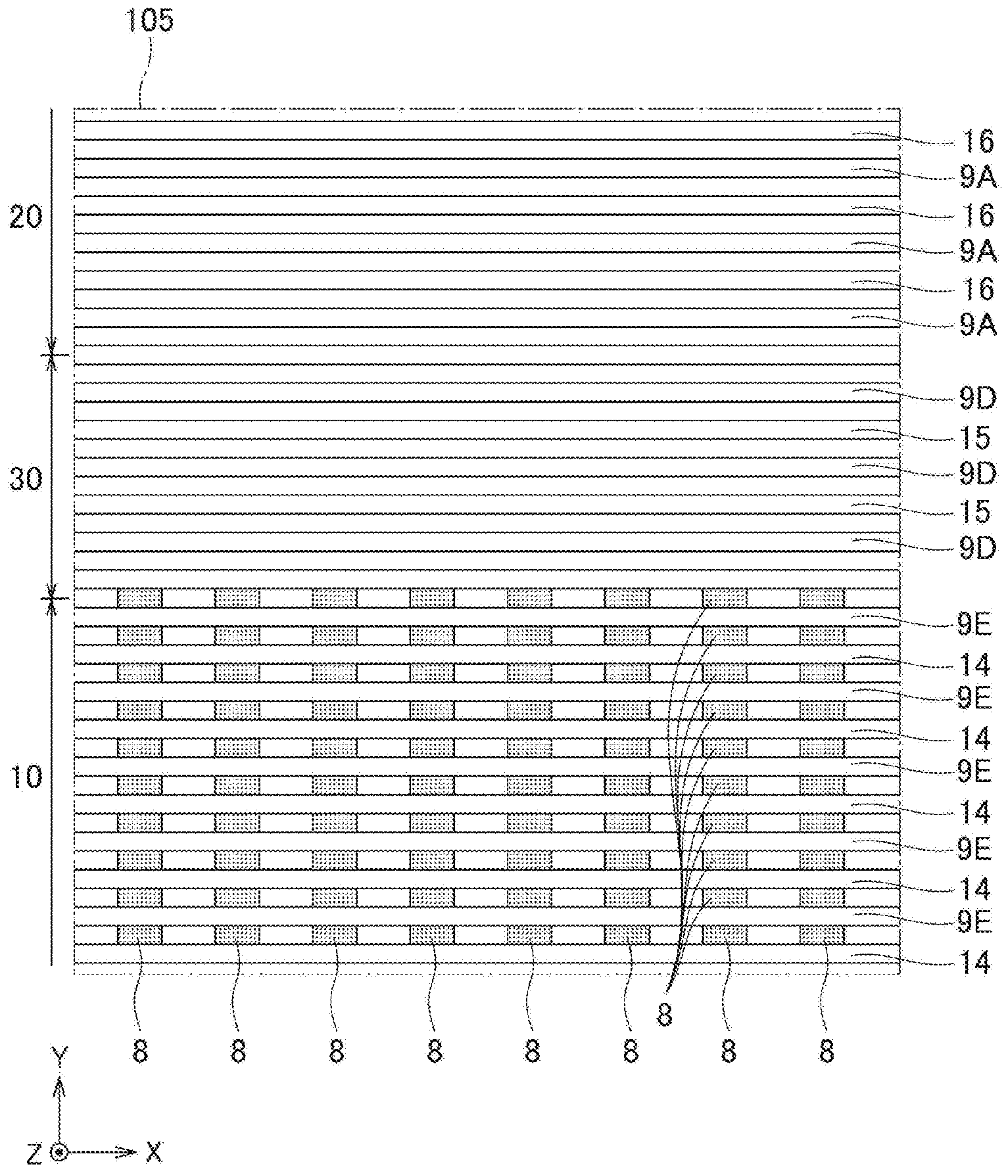
FIG. 13 is a diagram illustrating an enlarged upper surface of a portion of FIG. 12.

FIG. 13 is an enlarged top view of the semiconductor device 105 of a portion of FIG. 12. FIG. 13 shows that the diode region 20, the boundary region (dummy region) 30 placed adjacent to the diode region 20 in the negative Y direction, and the IGBT region 10 placed adjacent to the boundary region 30 in the negative Y direction are arranged.

The semiconductor device 104 according to the second embodiment differs from the semiconductor device 100 according to the first embodiment only in that the IGBT region 10, the diode region 20, and the dummy region 30 are arranged in a stripe shape. Other configurations are the same as those of the first embodiment and its modifications. Therefore, duplicate explanations are omitted.

In the second embodiment, the semiconductor device in which the snapback phenomenon is suppressed may be provided in the same manner as in the first embodiment.

Other Embodiments

Although one or more embodiments have been described as above, the articles and drawings that form part of the disclosure may not be considered to limit the technical scope. From this disclosure, various alternative embodiments, examples, and operational techniques will become apparent to those skilled in the art. Thus, the technical scope may include various embodiments not described herein. For example, as shown in the example where the trenches 14, 15, and 16 do not penetrate the accumulation region 6, at least one trench may penetrate the accumulation region 6, or the IGBT region 10, the diode region 20, and the dummy region 30 may not be provided with an accumulation region 6.

The one or more embodiments may describe an example in which a first conductivity type is an n-type, and a second conductivity type is a p-type. However, it is also possible in accordance with disclosed and recited embodiments that the examples may be implemented in a reverse relation of the conductivity types, e.g. where the first conductivity type is the p-type, and the second conductivity type is the n-type.

As described above, the semiconductor device according to one or more embodiments may suppress the snapback phenomenon.

The invention claimed is:

1. A semiconductor device comprising:
- a first semiconductor portion comprising:
  - a first semiconductor region of a first conductivity type;
  - a second semiconductor region of a second conductivity type that is arranged above the first semiconductor region;
  - a third semiconductor region of the first conductivity type that is arranged above the second semiconductor region;
  - a first trench penetrating the second semiconductor region in a depth direction;
  - a first inner trench electrode that is arranged in the first trench through a first insulating film;
  - a fourth semiconductor region of the second conductivity type that is arranged under the first semiconductor region and on an opposite side of the second semiconductor region;
  - an upper electrode electrically connected to the third semiconductor region; and
  - a lower electrode electrically connected to the fourth semiconductor region;
- a second semiconductor portion comprising:
  - a fifth semiconductor region of the second conductivity type that is electrically connected to the upper electrode and arranged above the first semiconductor region;
  - a sixth semiconductor region of the first conductivity type that is arranged under the first semiconductor region, and is electrically connected to the lower electrode, and is arranged on the opposite side of the fifth semiconductor region;
  - a second trench penetrating the fifth semiconductor region in the depth direction; and
  - a second inner trench electrode that is arranged in the second trench through a second insulating film; and
- a dummy region comprising:
  - a seventh semiconductor region of the second conductivity type that is arranged on the first semiconductor region between the first semiconductor portion and the second semiconductor portion;
  - a third trench penetrating the seventh semiconductor region in the depth direction; and
  - a third inner trench electrode electrically connected to the first inner trench electrode through a third insulating film in the third trench.

2. The semiconductor device according to claim 1, wherein
- the third semiconductor region is not arranged above the seventh semiconductor region, and
- the fourth semiconductor region is arranged under the first semiconductor region and on an opposite side of the seventh semiconductor region.

3. The semiconductor device according to claim 1, wherein
- the first trench connects with the third trench arranged in a first direction extended to the first trench, and
- the first inner trench electrode and the third inner trench electrode are electrically connected inside an area where the first and the third trenches are connected.

4. The semiconductor device according to claim 3, wherein
- the third trench connects with an adjacent third trench through a connection trench on a side of the second semiconductor portion to which the third trench is extended,
- a third inner trench electrode is placed in the connection trench via the third insulating film.

5. The semiconductor device according to claim 3, wherein
- the second trench extends in the first direction,
- the semiconductor device comprises an eighth semiconductor region of the second conductivity type that is arranged above the first semiconductor region between the first direction of the second trench and the first direction of the third trench,
- a distance in the first direction between the eighth semiconductor region and the third semiconductor region is longer than the distance in a second direction orthogonal to the first direction between the eighth semiconductor region and the third semiconductor region.

6. The semiconductor device according to claim 1, wherein
- in a plan view, a direction from the second semiconductor portion to the first semiconductor portion and a direction from the third inner trench electrode provided between the first semiconductor portion to the second semiconductor portion are not parallel.

7. The semiconductor device according to claim 6, wherein
- in a plan view, the dummy region is arranged to surround a periphery of the second semiconductor portion, and the first semiconductor portion is arranged to surround a periphery of the dummy region.

* * * * *